(12) United States Patent
Shimizu et al.

(10) Patent No.: US 7,691,357 B2
(45) Date of Patent: *Apr. 6, 2010

(54) METHOD FOR PRODUCING POLYCRYSTALLINE SILICON

(75) Inventors: Takaaki Shimizu, Niigata (JP); Kyoji Oguro, Niigata (JP); Takeshi Aoyama, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/190,229

(22) Filed: Aug. 12, 2008

(65) Prior Publication Data

US 2009/0060822 A1 Mar. 5, 2009

(30) Foreign Application Priority Data

Sep. 5, 2007 (JP) .............................. 2007-229856

(51) Int. Cl.
*C01B 33/08* (2006.01)
*C07F 7/00* (2006.01)

(52) U.S. Cl. .................. 423/349; 423/342; 423/345; 556/473

(58) Field of Classification Search ................. 423/324, 423/341, 342, 348–351; 556/466, 473
See application file for complete search history.

(56) References Cited

U.S. PATENT DOCUMENTS 4,340,574 A * 7/1982 Coleman .................... 423/347

5,939,577 A * 8/1999 Wheeler et al. ............. 556/477

(Continued)

FOREIGN PATENT DOCUMENTS

JP    1-278411    * 11/1989

(Continued)

OTHER PUBLICATIONS

Brinson, J. Ashley, Recovery of Valuable Chlorosilane Intermediates by a Novel Waste Conversion Process, Jun. 20, 2002, US Department of Energy (Office of Scientific and Technical Information), DOE/AL/99566-4 (Report Number), p. 5.*

(Continued)

*Primary Examiner*—Stuart Hendrickson
*Assistant Examiner*—Richard M Rump
(74) *Attorney, Agent, or Firm*—Oblon, Spivak, McClelland, Maier & Neustadt, L.L.P.

(57) ABSTRACT

A by-product mixture produced when polycrystalline silicon is deposited on a base material in a CVD reactor is made to react with chlorine to form a tetrachlorosilane (STC) effluent in a chlorination reaction vessel, and the tetrachlorosilane (STC) distillate is made to react with hydrogen in a hydrogenation reaction vessel to be converted into trichlorosilane (TCS). In the chlorination step, poly-silane contained in the above described by-product mixture can be efficiently recycled as a raw material for producing the polycrystalline silicon, which can enhance a yield of the production process. In addition, in the chlorination step, methyl chlorosilanes having boiling points close to TCS are hyper-chlorinated to be converted into hyper-chlorinated methyl chlorosilanes having higher boiling points, which facilitates the hyper-chlorinated methyl chlorosilanes to be separated into high concentration, and reduces carbon contamination of the polycrystalline silicon.

19 Claims, 4 Drawing Sheets

U.S. PATENT DOCUMENTS 7,033,561 B2 * 4/2006 Kendig et al. ............ 423/349
2004/0052716 A1 3/2004 Wakamatsu et al.
2004/0131528 A1 7/2004 Kendig et al.

FOREIGN PATENT DOCUMENTS

JP 2004-532786 10/2004

WO WO 02/100776 A1 12/2002

OTHER PUBLICATIONS

U.S. Appl. No. 12/135,487, filed Jun. 9, 2008, Shimizu, et al.
U.S. Appl. No. 12/190,151, filed Aug. 12, 2008, Shimizu, et al.
U.S. Appl. No. 12/203,395, filed Sep. 3, 2008, Shimizu, et al.

* cited by examiner

METHOD FOR PRODUCING POLYCRYSTALLINE SILICON

BACKGROUND OF THE INVENTION

1. Field of the Invention

The present invention relates to a production technology for obtaining polycrystalline silicon by reacting trichlorosilane (TCS) with hydrogen.

2. Description of the Related Art

In a process for producing high-purity polycrystalline silicon of a semiconductor grade, generally a "Siemens method" of reducing a trichlorosilane (TCS) gas and depositing the product on a silicon rod has been widely used.

As for the Siemens method, National Publication of International Patent Application No. 2004-532786 (Patent Document 1) discloses an invention relating to a method of producing polycrystalline silicon, which newly includes a step of converting disilane ($H_nCl_{6-n}Si_2$: n is a value of 0 to 6) that exists in a gaseous effluent coming out from a CVD process for producing polycrystalline silicon, into mono-silane, in a hydrogenation reaction vessel for converting tetrachlorosilane (STC) into trichlorosilane (TCS). The method is evaluated to have advantages of enhancing a yield of a hydrogenation process by combining a hydrogenation reaction with a thermal decomposition reaction of disilane in the same reaction vessel which is the hydrogenation reaction vessel, and the like.

Incidentally, a by-product mixture produced when polycrystalline silicon is deposited by reacting TCS with hydrogen also includes a poly-silane ($H_{2(n+1)-m}Cl_mSi_n$: n is an integer of 3 or 4 and m is an integer of 0 to 2(n+1)), other than disilane having a silicon atom number n of 2. Accordingly, if these poly-silanes can be effectively used, the by-product mixture produced in the step of depositing the polycrystalline silicon is facilitated to be recycled as a raw material for producing the polycrystalline silicon, and a yield of the production process is further enhanced.

In other words, a conventional method of producing polycrystalline silicon including a method disclosed in National Publication of International Patent Application No. 2004-532786 (Patent Document 1) has a room to be improved in a process of converting the above described by-product mixture into a raw material for producing the polycrystalline silicon.

In addition, in order to produce high-purity polycrystalline silicon of a semiconductor grade, it is required to enhance the purity of TCS which is to be the raw material. As a result, it is needed to prepare a step for removing impurities in the TCS and the by-product which are circulated and used in the process for producing the polycrystalline silicon. Accordingly, it is extremely important from a practical standpoint to design the process so as to facilitate the removal of impurities from the TCS and the by-product which are circulated and used in the process for producing the polycrystalline silicon.

SUMMARY OF THE INVENTION

The present invention is designed with respect to such a problem, and is directed at providing a method for producing polycrystalline silicon, which can further enhance the yield in a process for producing the polycrystalline silicon, and easily remove impurities from the TCS and the by-product which are circulated and used in the process.

In order to solve such a problem, a method for producing polycrystalline silicon according to the present invention includes: (A) a CVD step of making trichlorosilane (TCS) react with hydrogen to make polycrystalline silicon deposit on a base material; (B) a chlorination step of making a by-product mixture which is produced in the CVD step and contains poly-silane represented by a chemical formula $H_{2(n+1)-m}Cl_mSi_n$ (wherein n is an integer of 2 to 4 and m is an integer of 0 to 2(n+1)) to react with chlorine and forming tetrachlorosilane (STC) effluent; and (C) a hydrogenation step of making tetrachlorosilane (STC) effluent formed in the chlorination step react with hydrogen into the trichlorosilane (TCS).

The method for producing polycrystalline silicon according to the present invention can further include a step of making an effluent containing methyl chlorosilane (MeCS) formed in the hydrogenation step circulate to the chlorination step and forming a hyper-chlorinated methyl chlorosilane.

In this case, the method for producing polycrystalline silicon may include a step of separating the hyper-chlorinated methyl chlorosilane from tetrachlorosilane (STC) distillate.

Furthermore, the method for producing polycrystalline silicon according to the present invention can further include a step of making an effluent containing a hyper-hydrogenated chlorosilane formed in the hydrogenation step circulate to the chlorination step and forming tetrachlorosilane (STC).

Furthermore, the method for producing polycrystalline silicon according to the present invention can further include a step of making an effluent containing a hyper-hydrogenated chlorosilane formed in the hydrogenation step circulate to the hydrogenation step and forming a lower-level-hydrogenated chlorosilane.

The method for producing polycrystalline silicon according to the present invention may include a step of making trichlorosilane (TCS) formed in the hydrogenation step circulate to the CVD step.

The method for producing polycrystalline silicon according to the present invention may include a step of isolating a mixture which contains mainly tetrachlorosilane (STC) and poly-silane, from a by-product mixture containing poly-silane produced in the CVD step, prior to the hydrogenation step.

In this case, the isolation step is a step of separating, for instance, the by-product mixture containing poly-silane produced in the CVD step into a low boils distillate containing trichlorosilane (TCS) and a high boils distillate containing tetrachlorosilane (STC), poly-silane and particulate silicon.

The method for producing polycrystalline silicon according to the present invention can include a step of making the low boils distillate circulate to the CVD step.

In addition, the method for producing polycrystalline silicon according to the present invention can include a step of removing the particulate silicon from the high boils distillate.

The method for producing polycrystalline silicon according to the present invention preferably includes a step of separating the effluent from the hydrogenation step into the distillate containing the methyl chlorosilane (MeCS) and the distillate containing the hyper-hydrogenated chlorosilane.

In the chlorination step of the method for producing polycrystalline silicon according to the present invention, a chlorination reaction is preferably carried out through any of a liquid-phase reaction under irradiation with light, a liquid-phase reaction in the presence of a radical initiator or a gas-phase reaction at a cleavage temperature of the molecule of chlorine or higher.

The reaction temperature in the hydrogenation step is, for instance, approximately 600 to 1,200° C. or approximately 400 to 600° C. In the latter case, the hydrogenation reaction is carried out in the presence of silicon.

When the reaction temperature in the hydrogenation step is approximately 400 to 600° C., hydrochloric acid (HCl) is preferably supplied to the hydrogenation step at the same time.

The method for producing polycrystalline silicon according to the present invention includes a step (chlorination step) of making a by-product mixture formed when the polycrystalline silicon is deposited in a CVD reaction to react with chlorine to form tetrachlorosilane (STC) effluent, and making the tetrachlorosilane (STC) effluent react with hydrogen to convert the tetrachlorosilane (STC) effluent into trichlorosilane (TCS); accordingly can efficiently recycle poly-silane contained in the above described by-product mixture as a raw material for producing the polycrystalline silicon; and can enhance a yield of the production process.

The method for producing polycrystalline silicon according to the present invention includes chlorination of methyl chlorosilanes having near-boiling points to TCS to convert the methyl chlorosilanes into hyper-chlorinated methyl chlorosilanes having higher boiling points in the chlorination step, accordingly facilitates the hyper-chlorinated methyl chlorosilanes to be separated into high concentration, reduces carbon contamination of polycrystalline silicon, and an amount of waste.

In this way, the chlorination step included in the present invention converts impurities which are by-products produced in the process for producing polycrystalline silicon, into reusables, enables the yield of the process for producing polycrystalline silicon to be further enhanced, and can easily remove impurities from the TCS and the by-product which are circulated and used in the process.

DESCRIPTION OF THE PREFERRED EMBODIMENTS

A method for producing polycrystalline silicon according to the present invention will now be described below with reference to the drawings. In the following description, polycrystalline silicon which is obtained through the method according to the present invention will be described as high-purity polycrystalline silicon of a semiconductor grade, but the present invention is also effective in obtaining the polycrystalline silicon of a solar cell grade or the like.

Figure 1:
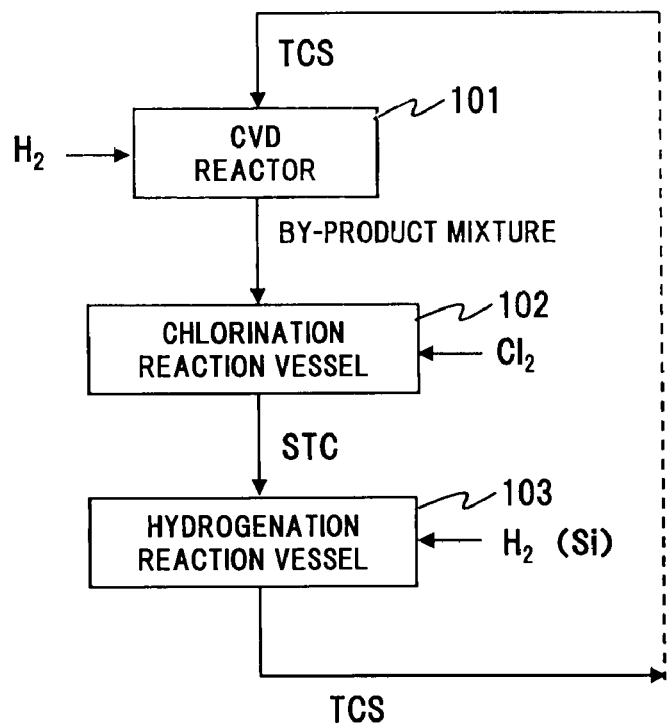
FIG. 1 is a view for describing a basic configuration (process) of a method for producing polycrystalline silicon according to the present invention.

[Basic configuration]: FIG. 1 is a view for describing a basic configuration (process) of a method for producing polycrystalline silicon according to the present invention. The method for producing the polycrystalline silicon includes: a CVD step of making the polycrystalline silicon deposit by reacting trichlorosilane (TCS) with hydrogen; a chlorination step of making a by-product produced in the CVD step including poly-silane represented by a chemical formula $H_{2(n+1)-m}Cl_mSi_n$ (where n is an integer of 2 to 4 and m is an integer of 0 to 2(n+1)) to react with chlorine to form tetrachlorosilane (STC) effluent; and a hydrogenation step of making the tetrachlorosilane (STC) effluent produced in the chlorination step react with hydrogen into trichlorosilane (TCS).

Trichlorosilane ($SiHCl_3$: TCS) which is a silicone source and hydrogen ($H_2$) are supplied into a CVD reactor 101, and are converted into polycrystalline silicon, which is deposited on a silicon rod (seed) electrically heated, through a "Siemens method" with a reduction reaction of TCS by hydrogen. Thus, high-purity polycrystalline silicon of a semiconductor grade is obtained (CVD step).

After this reaction, the CVD reactor 101 results in containing a by-product mixture including dichlorosilane ($SiH_2Cl_2$: DCS), tetrachlorosilane ($SiCl_4$: STC), poly-silane, particulate silicon and the like, all of which have been formed during the reduction reaction, in addition to unreacted TCS. Here, poly-silane means a chemical compound which is generally represented by chemical formula $H_{2(n+1)-m}Cl_mSi_n$ (where n is an integer of 2 to 4 and m is an integer of 0 to 2(n+1)).

The by-product mixture is discharged from the CVD reactor 101, is supplied to a chlorination reaction vessel 102, and is reacted with chlorine ($Cl_2$) to form tetrachlorosilane (STC) effluent (chlorination step). In this chlorination step, tetrachlorosilane (STC) is formed from poly-silane by making the by-product mixture supplied from the above described CVD reactor 101 to react with chlorine, for instance, through a liquid-phase reaction in a temperature range of approximately −20 to 100° C. or a gas-phase reaction at a temperature of 400° C. or higher.

Figure 2:
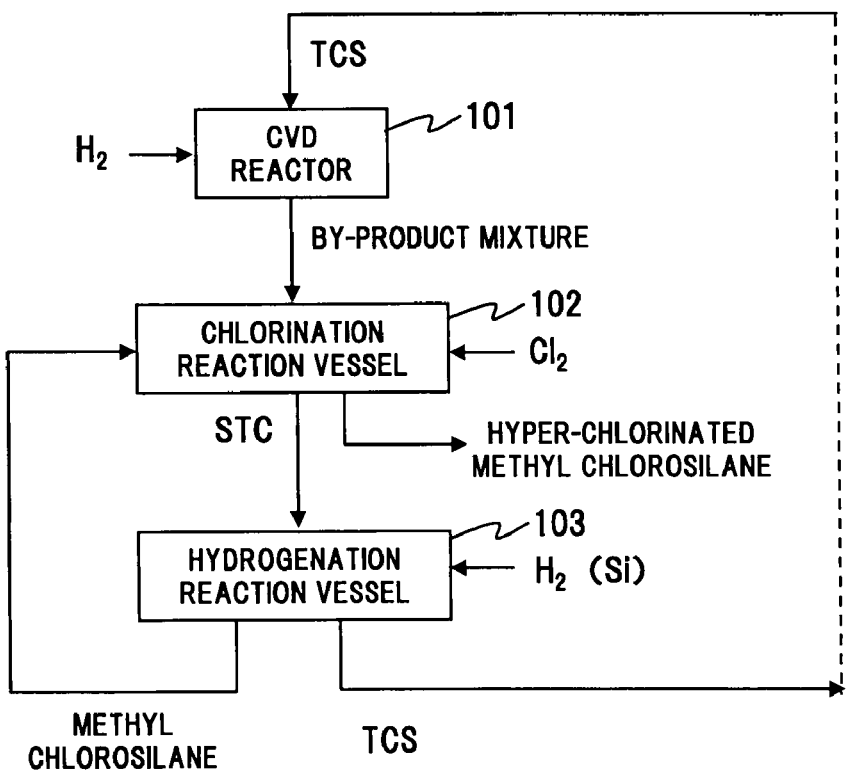
FIG. 2 is a view for describing another configuration example (first example) of a method for producing polycrystalline silicon according to the present invention.

In addition, in the chlorination step, an effluent including methyl chlorosilane (MeCS) formed in the hydrogenation step can be circulated to the chlorination step and be reacted with chlorine to form a hyper-chlorinated methyl chlorosilane from MeCS, as illustrated in FIG. 2.

These reactions will now be shown by chemical formulae below. In a reaction in which tetrachlorosilane (STC) is formed from poly-silane, when poly-silane is assumed to be pentachlorodisilane ($Si_2HCl_5$), hydrogen of an Si—H bond in pentachlorodisilane is chlorinated, and simultaneously an Si—Si bond is cleaved to newly form an Si—Cl bond, through the reaction formula (1) shown below. As a result, 2 moles STC are produced from 1 mole pentachlorodisilane.

$$Si_2HCl_5 + 2Cl_2 \rightarrow 2SiCl_4 + HCl \qquad \text{Reaction formula (1)}$$

The above described reaction formula (1) is illustrated on the assumption that poly-silane is pentachlorodisilane, but even when being hexachlorodisilane or heptachlorotrisilane, for instance, other than pentachlorodisilane, the poly-silane similarly forms STC through a reaction of forming the Si—Cl bond from the Si—H bond and forming the Si—Cl bond while cleaving the Si—Si bond.

In a reaction of producing a hyper-chlorinated methyl chlorosilane from MeCS, two reactions competitively proceed as are shown in the following reaction formula (2), when methyl chlorosilane is assumed to be methyl dichlorosilane ($CH_3SiHCl_2$). One is a reaction (upper formula) in which a hyper-chlorinated methyl chlorosilane ($CH_3SiCl_3$) is formed through the chlorination of an Si—H bond in the methyl dichlorosilane, and the other is a reaction (lower formula) in which a hyper-chlorinated methyl chlorosilane ($CH_2ClSiHCl_2$) is formed through the chlorination of a C—H bond in a methyl group of a $CH_3$—Si bond. When excessive chlorine exists in the chlorination reaction vessel, the chlorination of the C—H bond further proceeds and a further hyperchlorinated methyl chlorosilane is produced.

$$CH_3SiHCl_2 + Cl_2 \rightarrow CH_3SiCl_3 + HCl$$

$$CH_3SiHCl_2 + Cl_2 \rightarrow CH_2ClSiHCl_2 + HCl \quad \text{Reaction formula (2)}$$

The above described reaction formula (2) is illustrated on the assumption that the methyl chlorosilane is methyl dichlorosilane ($CH_3SiHCl_2$), but even when the methyl chlorosilane is another methyl chlorosilane (for instance, $CH_3SiCl_3$, $(CH_3)_2SiHCl$, $(CH_3)_2SiCl_2$, $(CH_3)_3SiCl$ and $CH_3SiH_2Cl$), hyperchlorinated methyl chlorosilane is similarly produced through a chlorination reaction for the Si—H bond, and a chlorination reaction for the C—H bond in the methyl group of the $CH_3$—Si bond.

In addition, an effluent containing methyl chlorosilane produced in the hydrogenation step may include a very small amount of hydrocarbon compounds such as isopentane having boiling points close to that of TCS, and the carbon hydrides are chlorinated at the same time to result in acquiring a higher boiling point.

Figure 3:
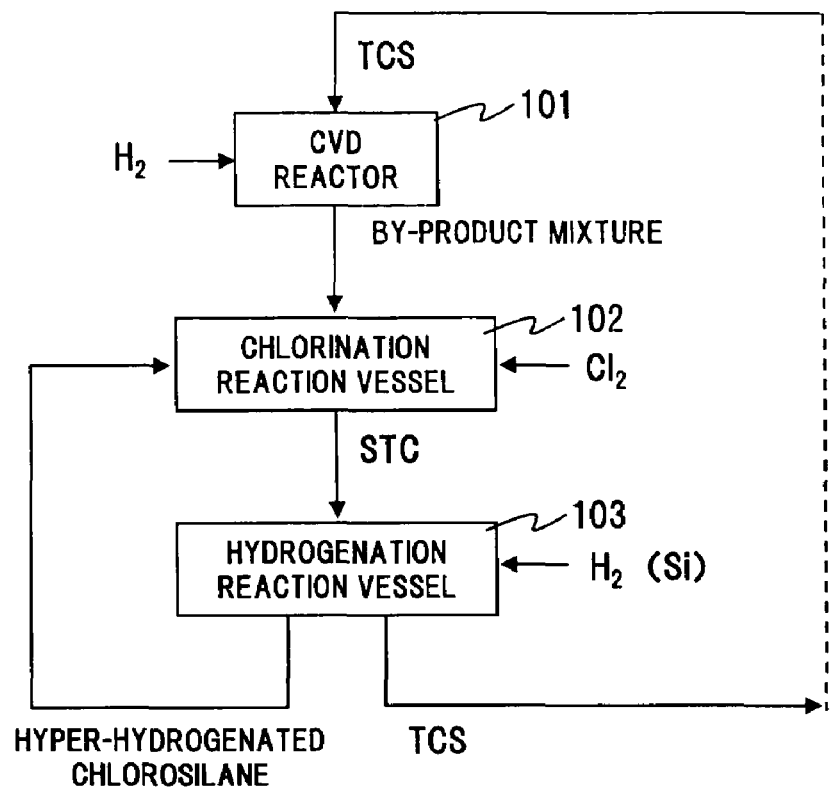
FIG. 3 is a view for describing another configuration example (second example) of a method for producing polycrystalline silicon according to the present invention.

Furthermore, in this chlorination reaction vessel 102, a hyper-hydrogenated chlorosilane circulated from a hydrogenation step to a chlorination step can be chlorinated to form a lower-level-hydrogenated chlorosilane such as TCS, as is illustrated in FIG. 3, for instance. As is illustrated in the following reaction formula (3), for instance, when the hyper-hydrogenated chlorosilane is dichlorosilane ($SiH_2Cl_2$: DCS), hydrogen in DCS is chlorinated and TCS is consequently formed which is the lower-level-hydrogenated chlorosilane.

$$SiH_2Cl_2 + Cl_2 \rightarrow SiHCl_3 + HCl \quad \text{Reaction formula (3)}$$

In the above described reaction formula (3) is illustrated on the assumption that the hyper-hydrogenated chlorosilane is DCS, but even other hyper-hydrogenated chlorosilanes or hyper-hydrogenated silane are subjected to the chlorination reaction for an Si—H bond consecutively, as is illustrated in the reaction formula (4) shown below. Thus, the hyper-hydrogenated chlorosilane is sequentially converted into STC by being repeatedly circulated to the chlorination step from the hydrogenation step.

$$SiH_4 + Cl_2 \rightarrow SiH_3Cl + HCl$$

$$SiH_3Cl + Cl_2 \rightarrow SiH_2Cl_2 + HCl$$

$$SiH_2Cl_2 + Cl_2 \rightarrow SiHCl_3 + HCl$$

$$SiHCl_3 + Cl_2 \rightarrow SiCl_4 + HCl \quad \text{Reaction formula (4)}$$

In this way, an effluent containing tetrachlorosilane (STC) formed in the chlorination step is supplied to a hydrogenation reaction vessel 103, and is reacted with hydrogen to be converted into trichlorosilane (TCS) (hydrogenation step). When the TCS is circulated to the above described CVD step, the TCS can be recycled as a raw material for producing polycrystalline silicon.

The chlorination reaction expressed by the above described reaction formulae (1) to (3) can be carried out through a liquid-phase reaction under irradiation with light, a liquid-phase reaction under the presence of a radical initiator, or a gas-phase reaction at a cleavage temperature of the molecule of chlorine or higher.

A chlorination reaction (photo-chlorination) under irradiation with light is a method of forming tetrachlorosilane (STC) from poly-silane by irradiating the poly-silane with light in the presence of chlorine. The usable light has a wavelength corresponding to the absorption wavelength of a Cl—Cl bond in the molecule of chlorine, and is emitted from a light source such as a low-pressure mercury lamp, a high-pressure mercury lamp and a xenon lamp, as is described in Japanese Patent Laid-Open No. 4-202007 (Patent Document 2).

In the case of a chlorination reaction in the presence of the radical initiator, AIBN (azobisisobutyronitrile), BPO (benzoyl peroxide) or the like is used as the radical initiator. However, when the radical initiator is employed, the radical initiator is thermally decomposed into a radical, and the radical causes a chain-reaction in the molecule of chlorine to produce Cl radical. When the radical initiator is thermally decomposed, an organic fragment having a low boiling point is simultaneously formed and becomes a contamination factor in the system. Accordingly, the organic fragment needs to be removed. For this reason, photo-chlorination without the need of using the radical initiator is preferred.

The chlorination reaction in the presence of the radical initiator can be carried out in a wide range of approximately −20° C. to 100° C., but can also be carried out in a temperature range (approximately 10 to 40° C.) at which special cooling and heat treatment are not required, because the reaction is a radical reaction and accordingly proceeds even at room temperature. Since the reaction is a liquid-phase reaction, the pressure is not restricted, but it is preferable to control the pressure into a range of atmospheric pressure to 0.2 MPa, from the viewpoint of the pressure resistance of a reaction vessel and the like.

An amount of chlorine to be introduced into a chlorination reaction vessel 102 needs to be at least a sufficient stoichiometric amount for progressing the chlorination reaction shown in the above described reaction formulae (1) to (3). However, because various reactions simultaneously and competitively proceed in the chlorination reaction vessel 102, when the concentration of the reaction raw material is low, the amount of chlorine needs to be greatly excessive. For instance, chlorine of approximately 5 to 15 times of the stoichiometric amount needs to be supplied.

However, chlorine which has not reacted with silane and chlorosilane compounds because the excessive amount of chlorine has been supplied and dissolves in a liquid produced by the reaction can be recovered from the produced liquid. Accordingly, if the unreacted chlorine would be recycled as chlorine for supply, the amount of chlorine to be supplied from the outside of the system can be almost equalized to the real consumption of chlorine, and a stoichiometric ratio of chlorine in the chlorination reaction vessel 102 can also be maintained to an intended condition (for instance, approximately 5 to 15 times of the stoichiometric amount).

The chlorination reaction expressed by the above described reaction formulae (1) to (3) can be carried out through a gas-phase reaction at a cleavage temperature of the molecule of chlorine or higher (preferably through gas-phase reaction at approximately 400° C. to 600° C.), but causes more side reactions compared to a liquid-phase reaction, and accordingly is less advantageous compared to the liquid-phase method from the viewpoint of energy consumption as well.

When the poly-silanes which are by-products produced in the above described CVD step are separated into single substances, the single substance has autogenously igniting properties. However, the poly-silanes exist in low concentration as a mixture with STC, accordingly make the operation and maintenance of the apparatus for the process simplified and more safety.

In a hydrogenation step, a hydrogenation reaction proceeds to convert STC into TCS, but in addition to the hydrogenation reaction, such conversion reactions also proceed at the same time as a reaction of converting TCS into dichlorosilane (DCS), a reaction of converting DCS into mono-chlorosilane (MCS) and a reaction of converting MCS into mono-silane ($SiH_4$: MS), though the amounts of the reactions are small. Accordingly, as is illustrated in FIG. 3, for instance, hyper-hydrogenated silanes such as DCS, MCS and MS can be mixed with some amount of TCS and the mixture can be distilled off (circulated) to a chlorination step from the hydrogenation step, and be chlorinated and converted into STC in the step. Then, the STC can be circulated and used in the hydrogenation step again. Furthermore, STC can be additionally supplied from the outside of the system, as one part of a raw material STC in the hydrogenation step.

A reaction in a hydrogenation step is classified generally into a hydrogenation reaction in a comparatively high temperature range of approximately 600 to 1,200° C., and a hydrogenation reaction in a comparatively low temperature range of approximately 400 to 600° C. (for instance, under pressure of approximately 100 to 600 psig) (see, for instance, National Publication of International Patent Application No. 2004-532786 (Patent Document 1), Japanese Patent Laid-Open No. 58-217422 (Patent Document 3) and the like). The hydrogenation reaction in the temperature range of approximately 600 to 1,200° C. is a gas-phase homogenous reaction, and proceeds according to the reaction formula (5) described below. The hydrogenation reaction in the temperature range of approximately 400 to 600° C. is a fluidized bed reaction, and proceeds according to the following reaction formula (6) and the following reaction formula (7) which occurs as a result of the following reaction formula (6).

$SiCl_4 + H_2 \rightarrow SiHCl_3 + HCl$  Reaction formula (5)

$3SiCl_4 + 3H_2 \rightarrow 3SiHCl_3 + 3HCl$

$Si + 3HCl \rightarrow SiHCl_3 + H_2$  Reaction formula (6)

$Si + 2H_2 + 3SiCl_4 \rightarrow 4SiHCl_3$  Reaction formula (7)

Accordingly, when the hydrogenation reaction is carried out in the temperature range of approximately 600 to 1,200° C., silicon does not need to be supplied. However, when the hydrogenation reaction is carried out in the temperature range of approximately 400 to 600° C., the silicon is supplied to the reaction, and the STC and other compounds are hydrogenated in the presence of the silicon.

In a hydrogenation step, STC effluent produced in a chlorination step reacts with carbon component in a hydrogenation reaction vessel or residual carbon in silicon (silicon of metallurgical grade) supplied from the outside, and forms by-products of methyl chlorosilanes (MeCS). The amount of the by-product is much more when the reaction temperature is higher.

These methyl chlorosilanes include a compound having a boiling point close to that of TCS. TCS has a boiling point of 31.5° C., whereas $(CH_3)_2SiHCl$ has a boiling point of 34.5° C. and $CH_3SiHCl_2$ has a boiling point of 41.0° C., for instance.

It is difficult for a normal distillation operation to completely remove these methyl chlorosilanes having the near boiling points to TCS. For this reason, the methyl chlorosilanes by-products which have the near boiling points and are regularly and continuously produced in the hydrogenation step are easily accumulated in the whole system of the process for producing polycrystalline silicon. As a result, the methyl chlorosilanes are concentrated into a higher concentration than that in the by-product reaction, and cause carbon contamination of polycrystalline silicon deposited in a CVD step by methyl chlorosilanes.

Even if a fine distillation column has a large number of trays installed so as to avoid such inconvenience, the methyl chlorosilanes are separated only as a mixture containing TCS and STC because the methyl chlorosilanes have boiling points close to that of TCS. For this reason, in order to prevent the methyl chlorosilanes from being accumulated and concentrated, the methyl chlorosilanes cannot help being discharged to the outside of the system together with a large quantity of TCS and STC, which has been a cause of the increasing in a production cost and a waste amount.

However, by using the above described reaction formula (2), the methyl chlorosilanes having boiling points close to that of TCS can be hyper-chlorinated into compounds having higher boiling points. For instance, $(CH_3)_2SiHCl$ having a boiling point of 34.5° C. is converted into $(CH_3)_2SiCl_2$ having a boiling point of 70.3° C. which is a higher boiling point.

The hyper-chlorinated methyl chlorosilanes obtained through the chlorination step are easily separated with a general distillation operation, accordingly can be easily separated into high concentration, and can be efficiently discharged (separated) to the outside of the system of a process for producing polycrystalline silicon, as is illustrated in FIG. 2, for instance. As a result, the contamination of polycrystalline silicon by carbon and a waste amount can be reduced. Incidentally, the hyper-chlorinated methyl chlorosilanes which have been separated into high concentration can be recycled as a raw material of a silicone resin and the like.

Thus, the chlorination step according to the present invention can further enhance a yield in a process for producing polycrystalline silicon by converting impurities which are by-products in the process for producing the polycrystalline silicon into reusables, and also can easily remove impurities from TCS and by-products which are circulated and used in the process. In particular, when the chlorination step is carried out through a liquid-phase reaction, the compounds can be chlorinated in room temperature with atmospheric pressure, so that the method according to the present invention has an advantage of showing a greater energy saving effect than a conventional method.

Figure 4:
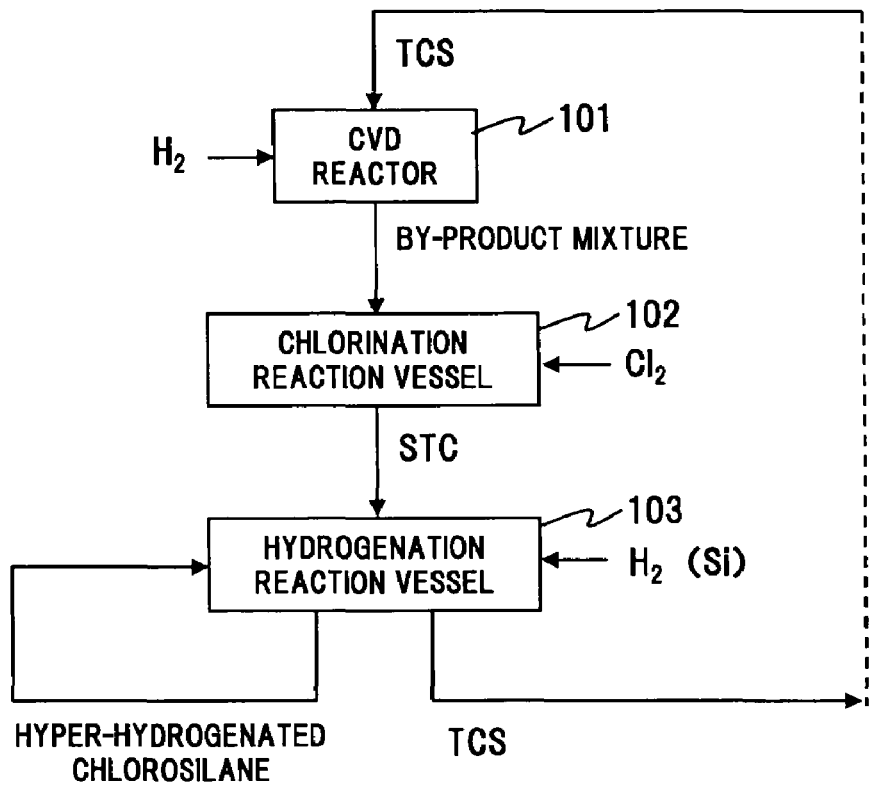
FIG. 4 is a view for describing another configuration example (third example) of a method for producing polycrystalline silicon according to the present invention.

In the present invention, an effluent mixture including a hyper-hydrogenated chlorosilane formed in a hydrogenation step can be circulated to the hydrogenation step again, as is illustrated in FIG. 4, for instance.

When a hydrogenation reaction is carried out in a comparatively low temperature range of approximately 400 to 600° C. (under pressure of approximately 100 to 600 psig), and when the hyper-hydrogenated chlorosilane is assumed to be DCS, a chemical reaction according to the following reaction formula (8) simultaneously proceeds together with the above described hydrogenation reaction occurring in the inside of a hydrogenation reaction vessel.

$3SiH_2Cl_2 \rightarrow 2SiHCl_3 + 2H_2 + Si$  Reaction formula (8)

In the present invention, $H_2$ and Si of by-products produced in the above described reaction formula (8) can be used as one part of hydrogen and silicon (for instance, metallurgical silicon) to be supplied to the reaction vessel in which STC is hydrogenated into TCS.

On the other hand, when the hydrogenation reaction is carried out in a comparatively high temperature range of approximately 600 to 1,200° C., and when the hyper-hydrogenated chlorosilane is assumed to be DCS, a chemical reaction according to the following reaction formula (9) simultaneously proceeds together with the above described hydrogenation reaction occurring in the inside of the hydrogenation reaction vessel.

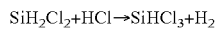

Reaction formula (9)

In the present invention, one part of HCl of a by-product produced in the hydrogenation reaction for STC is used as HCl (HCl in left-hand side) which is a raw material in the above described reaction formula (9), and a by-product $H_2$ produced in the reaction can be used as one part of a hydrogenating raw material for STC.

The above described reaction formulae (8) and (9) are shown on the assumption that the hyper-hydrogenated chlorosilane is DCS, but other hyper-hydrogenated chlorosilanes can also be circulated (collected) to the hydrogenation step.

Figure 5:
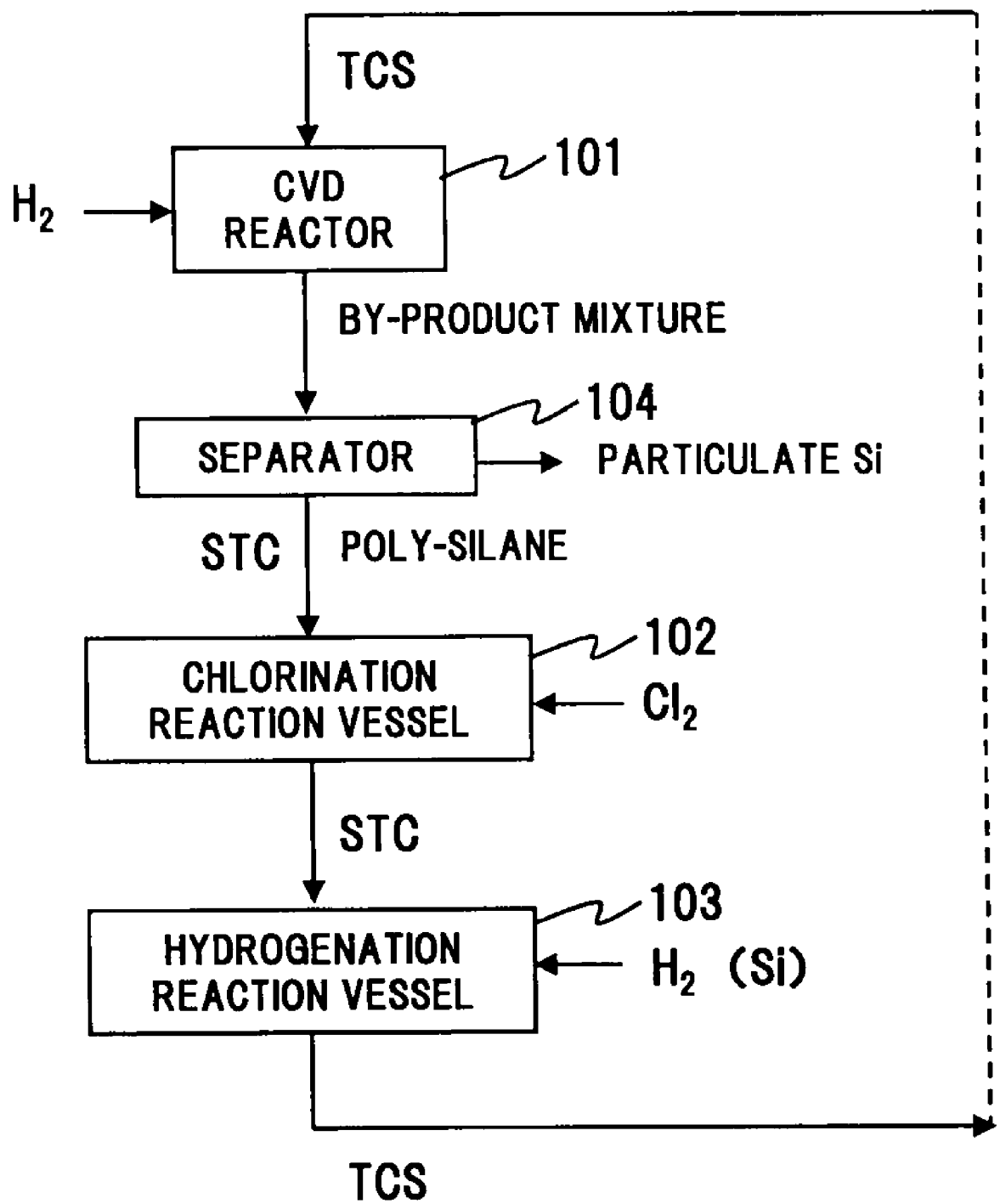
FIG. 5 is a view for describing another configuration example (fourth example) of a method for producing polycrystalline silicon according to the present invention.

In addition, a by-product mixture containing poly-silane produced in a CVD step is preferably separated (isolated) into a mixture containing mainly STC and poly-silane, prior to a hydrogenation step, as is illustrated in FIG. 5, for instance. The by-product mixture shall be separated through a plurality of separation steps which preferably include a step that can separate the by-product mixture into a low boils distillate containing TCS and a high boils distillate containing STC, poly-silane and particulate silicone, and further preferably include a step that can separate particulate silicon from the above described high boils distillate.

In addition, when a hydrogenation reaction is carried out in a comparatively low temperature range of approximately 400 to 600° C., hydrogen chloride (HCl) may be supplied to the inside of a hydrogenation reaction vessel from outside at the same time, though the passage is not shown in the figure, and hydrogen chloride of a by-product produced in a CVD step and a chlorination step may be recovered for a reaction with (metallic) silicon in a hydrogenation step and may be recycled as a TCS raw material. A hyper-hydrogenated chlorosilane is contained not only in the effluent of the hydrogenation step for STC, but also in an exhaust gas of a by-product produced in a CVD step for obtaining polycrystalline silicon. The hyper-hydrogenated chlorosilane can also be recirculated to the hydrogenation step for STC, and can be effectively used as a raw material for TCS.

Other Configuration Examples

FIGS. 2 to 5 are views for describing other configuration examples (process examples) of a method for producing polycrystalline silicon according to the present invention.

The configuration example illustrated in FIG. 2 has the above described basic configuration (process), and in addition, has further a step of making a distillate containing methyl chlorosilane (MeCS) formed in a hydrogenation step (hydrogenation reaction vessel 103) circulate to a chlorination step (chlorination reaction vessel 102) to form a hyper-chlorinated methyl chlorosilane.

The configuration example also has a step of separating the hyper-chlorinated methyl chlorosilane formed in the chlorination step (chlorination reaction vessel 102) from tetrachlorosilane (STC) distillate.

The configuration example illustrated in FIG. 3 has the above described basic configuration (process), and in addition, has further a step of making a distillate containing a hyper-hydrogenated chlorosilane formed in a hydrogenation step (hydrogenation reaction vessel 103) circulate to a chlorination step (chlorination reaction vessel 102) to form tetrachlorosilane (STC).

The configuration example illustrated in FIG. 4 has the above described basic configuration (process), and in addition, has further a step of making a distillate containing a hyper-hydrogenated chlorosilane formed in a hydrogenation step (hydrogenation reaction vessel 103) circulate to a hydrogenation step to form a lower-level-hydrogenated chlorosilane.

The configuration example illustrated in FIG. 5 has the above described basic configuration (process), and in addition, has further a step (separator 104) of separating a mixture which contains mainly tetrachlorosilane (STC) and poly-silane, from a by-product mixture containing poly-silane produced in a CVD step (CVD reactor 101), prior to a chlorination step (chlorination reaction vessel 102) and a hydrogenation step (hydrogenation reaction vessel 103).

These configuration examples only illustrate aspects of a process for producing polycrystalline silicon according to the present invention, and the present invention can include various aspects.

Configuration Example for Commercial Process

Figure 6:
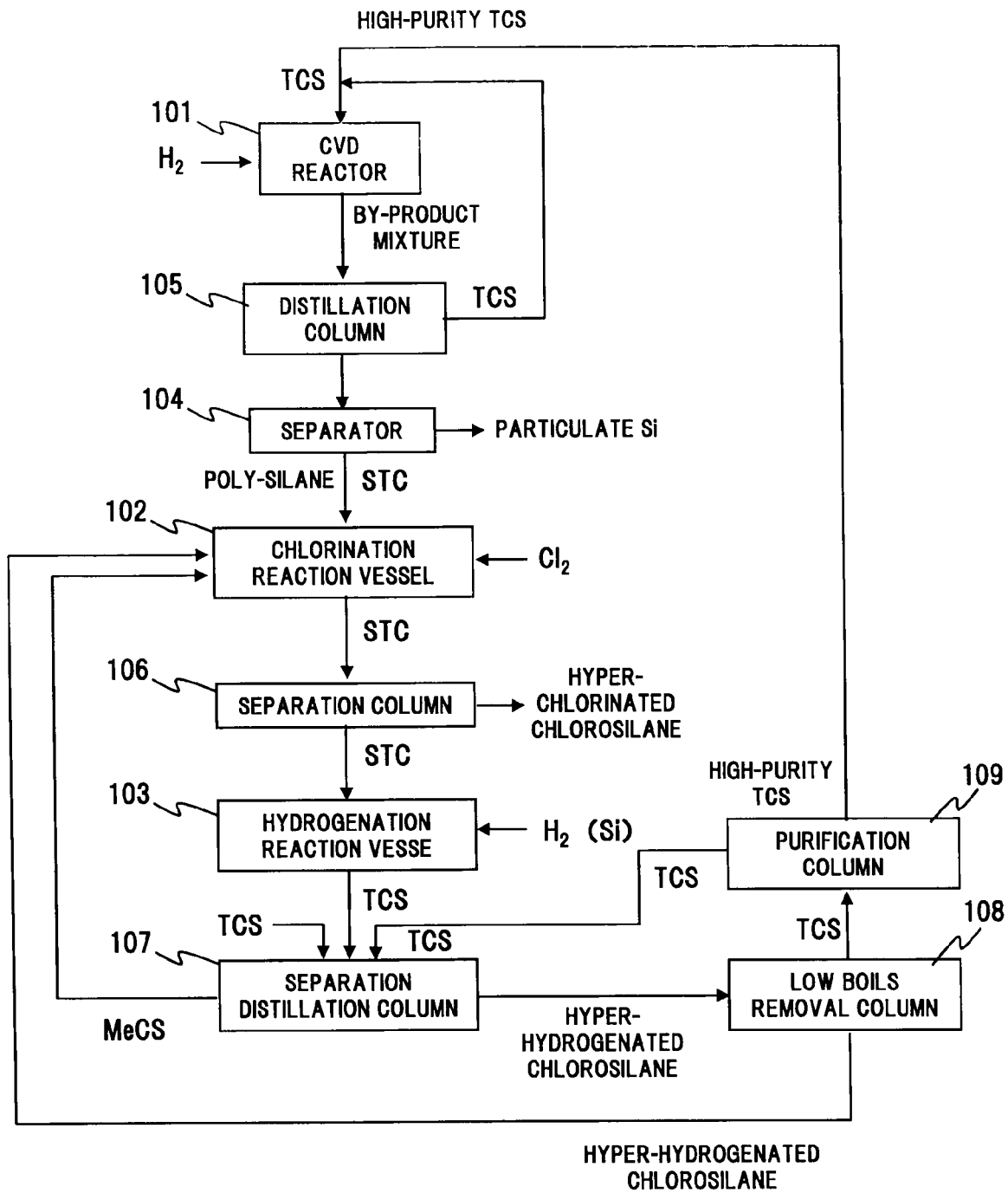
FIG. 6 is a view for describing a commercial process example of a method for producing polycrystalline silicon according to the present invention.

FIG. 6 is a view for describing a commercial process example of a method for producing polycrystalline silicon according to the present invention.

At first, TCS and $H_2$ are supplied to a CVD reactor 101, in which polycrystalline silicon is deposited on a heated element. A by-product mixture which includes a mixture of unreacted TCS, by-produced STC and low boils chlorosilanes represented by DCS as a main component and poly-silane, particulate silicon and the like as a minor component is discharged from the CVD reactor 101, and is supplied to a distillation column 105. The low boils distillate represented by TCS and DCS is distilled off from an upper part of the distillation column 105, is circulated to the CVD reactor 101, and can be recycled as a raw material for the deposition of polycrystalline silicon.

On the other hand, a high boils distillate containing STC, poly-silane and particulate silicon is distilled off from the bottom of the distillation column 105, and is supplied to a separator 104. In the separator 104, the particulate silicon is removed from the above described high boils distillate, and a mixture of poly-silane and STC in a liquid-phase state is supplied to a chlorination reaction vessel 102.

A distillate containing methyl chlorosilane (MeCS) produced in a separation distillation column 107, a distillate containing a hyper-hydrogenated chlorosilane produced in a low boils removal column 108, and chlorine are supplied to the chlorination reaction vessel 102, and are chlorinated there according to the above described reaction formula.

A distillate containing STC produced in the chlorination reaction vessel 102 is discharged to a separation column 106. Here, the hyper-chlorinated chlorosilane is separated, and STC is discharged to a hydrogenation reaction vessel 103.

In the hydrogenation reaction vessel 103, STC supplied from the separation column 106 and hydrogen (and silicon) supplied from the outside are reacted to convert approximately 15 to 30 mol % STC into TCS, for instance. A product produced in the hydrogenation reaction vessel 103 is supplied to a separation distillation column 107.

The separation distillation column 107 is a distillation column for separating a distillate produced in the hydrogenation step into a distillate containing methyl chlorosilane (MeCS) and a distillate containing a hyper-hydrogenated chlorosilane. To the separation distillation column 107, TCS is supplied from a purification column 109 and also from the outside of the system. From the top of the column, TCS containing hyper-hydrogenated silane, for examples DCS and MCS, of a higher order than TCS (distillate containing hyper-hydrogenated chlorosilane) is distilled off, and on the other hand, STC containing methyl chlorosilanes (MeCS) and a small amount of TCS is distilled off from the bottom of the column. The latter is circulatingly supplied to the chlorination reaction vessel 102.

A distillate discharged from the top of the separation distillation column 107 (distillate containing hyper-hydrogenated chlorosilane) is further supplied to a low boils removal column 108. In the low boils removal column 108, a distillate containing some TCS and a hyper-hydrogenated chlorosilane of a not lower order than DCS is distilled off, and is supplied to the chlorination reaction vessel 102. On the other hand, from the bottom TCS is supplied to the purification column 109.

The purification column 109 has a role of final back up for assuring the quality of TCS though the quality may fluctuate according to the variation of an operation condition in upstream facilities, and finally distills off high purity TCS of a raw material for polycrystalline silicon from the top of the column. The high purity TCS is circulatingly supplied to the CVD reactor 101. In addition, a small amount of TCS is distilled off from the purification column 109 and is circulatingly supplied to the separation distillation column 107.

Example

Polycrystalline silicon was produced according to the process illustrated in FIG. 6. In a CVD reactor 101, a by-product mixture containing approximately 65 to 75 mol % of TCS, 25 to 35 mol % of STC, 0.1 to 2 mol % of DCS, 0.03 to 0.5 mol % of poly-silane (mainly, $Si_2Cl_6$ and $Si_2HCl_5$) and a small amount of particulate silicon were formed. The by-product mixture was supplied to a distillation column 105. There, TCS was distilled off as overhead, was circulatingly supplied to the CVD reactor 101, and was recycled as a raw material for depositing polycrystalline silicon.

A high boils distillate including STC, poly-silane and particulate silicon in the by-product mixture was supplied to a separator 104, and was subjected to separation treatment under the conditions of a little number of trays, a little reflux ratio and a small quantity of evaporation, in such a range that the solid content could not be distilled off from the top of the column and the poly-silane could be discharged as the overhead distillate.

From the separator 104, the overhead distillate including 99 mol % of STC and the balance poly-silane (poly-silane of approximately 90 mol % supplied to separator 104) was supplied to a chlorination reaction vessel 102. A sample port was placed in a flow line between the separator 104 and the chlorination reaction vessel 102, and samples were periodically withdrawn for analysis through gas chromatography and visual observation. The withdrawn sample contained precisely 0.16 to 0.26 mol % of poly-silane and was confirmed not to contain particulate silicon.

This distillate, a STC distillate containing approximately 0.01 mol % methyl chlorosilane produced in a separation distillation column 107 and a hyper-hydrogenated chlorosilane distillate containing approximately 60% TCS produced in a low boils separation column 108 were supplied to the chlorination reaction vessel 102, and were chlorinated there according to the above described method.

A reaction distillate produced in the chlorination reaction vessel 102 was supplied to a separation column 106. STC which did not contain a hyper-chlorinated methyl chlorosilane was distilled off from the top of the column, and was supplied to a hydrogenation reaction vessel 103. In addition, a hyper-chlorinated methyl chlorosilane containing approximately 80 mol % STC was distilled off from the bottom of the column to the outside of the system. The amount of the STC distilled off to the outside of the system was a very small amount corresponding to 0.03% of STC supplied to the separation column 106.

In the hydrogenation reaction vessel 103, STC supplied from the separation column 106 was reacted with metallurgical silicon and hydrogen under the conditions of 550° C. and 2.5 Mpag. As a result, approximately 70 mol % of unreacted STC and a TCS product containing approximately 1 mol % of a hyper-hydrogenated chlorosilane were obtained.

The TCS product was supplied to the separation distillation column 107, and was mixed with a TCS distillate supplied from the bottom of a purification column 109 and TCS supplied from the outside of the system. Then, the mixture was distilled and separated. From the top of the separation distillation column 107, TCS containing approximately 4 mol % of a hyper-hydrogenated chlorosilane was distilled off and was supplied to the low boils removal column 108. From the bottom of the column, STC containing approximately 0.01 mol % of methyl chlorosilane was distilled off and was circulatingly supplied to the chlorination reaction vessel 102.

In the low boils removal column 108, hyper-hydrogenated chlorosilane containing approximately 60 mol % of TCS was distilled off from the top of the column, and was supplied to the chlorination reaction vessel 102. TCS was distilled off from the bottom of the column, and was supplied to the purification column 109.

In the purification column 109, approximately 3% of supplied TCS was distilled off from the bottom of the column, and was circulatingly supplied to the separation distillation column 107. The refined high purity TCS was distilled off from the top of the column, was supplied to the CVD reactor 101, and was recycled as the raw material for depositing the polycrystalline silicon.

As described above, the present invention provides a method for producing polycrystalline silicon, which can further enhance a yield in a process for producing polycrystalline silicon, and easily remove impurities from the TCS and the by-product which are circulated and used in the process.

What is claimed is:

1. A method for producing polycrystalline silicon comprising:
   (A) a CVD step of making trichlorosilane (TCS) react with hydrogen to make polycrystalline silicon deposit on a base material;
   (B) a chlorination step of making a by-product mixture which is produced in the CVD step and contains poly-silane represented by a chemical formula $H_{2(n+1)-m}Cl_m\text{-}Si_n$ (wherein n is an integer of 2 to 4 and m is an integer of 0 to 2(n+1)) to react with chlorine and forming tetrachlorosilane (STC) distillate;
   (C) a hydrogenation step of making tetrachlorosilane (STC) distillate formed in the chlorination step react with hydrogen into the trichlorosilane (TCS), and
   (D) a circulation step of making a distillate containing methyl chlorosilane (MeCS) formed in the hydrogenation step with residual carbon from the reactor or present in the silicon circulate to the chlorination step and forming a hyper-chlorinated methyl chlorosilane.

2. The method for producing the polycrystalline silicon according to claim 1 comprising a step of separating the hyper-chlorinated methyl chlorosilane from the tetrachlorosilane (STC) distillate.

3. The method for producing the polycrystalline silicon according to claim 1 further comprising a step of making a distillate containing a hyper-hydrogenated chlorosilane formed in the hydrogenation step circulate to the chlorination step and forming tetrachlorosilane (STC).

4. The method for producing the polycrystalline silicon according to claim 1 further comprising a step of making a distillate containing a hyper-hydrogenated chlorosilane formed in the hydrogenation step circulate to the hydrogenation step and forming a lower-level-hydrogenated chlorosilane.

5. The method for producing the polycrystalline silicon according to claim 1 comprising a step of making the trichlorosilane (TCS) formed in the hydrogenation step circulate to the CVD step.

6. The method for producing the polycrystalline silicon according to claim 1 comprising a step of isolating a mixture which contains mainly tetrachlorosilane (STC) and poly-silane, from a by-product mixture containing poly-silane produced in the CVD step, prior to the hydrogenation step.

7. The method for producing the polycrystalline silicon according to claim 6, wherein the isolation step is a step of separating the by-product mixture containing poly-silane produced in the CVD step into a low boils distillate containing trichlorosilane (TCS) and a high boils distillate containing tetrachlorosilane (STC), poly-silane and particulate silicon.

8. The method for producing the polycrystalline silicon according to claim 7 comprising a step of making the low boils distillate circulate to the CVD step.

9. The method for producing the polycrystalline silicon according to claim 7 comprising a step of removing the particulate silicon from the high boils distillate.

10. The method for producing the polycrystalline silicon according to claim 1 comprising a step of separating the distillate produced in the hydrogenation step into the distillate containing the methyl chlorosilane (MeCS) and the distillate containing the hyper-hydrogenated chlorosilane.

11. The method for producing the polycrystalline silicon according to claim 1, wherein a chlorination reaction in the chlorination step is carried out through any of a liquid-phase reaction under irradiation with light, a liquid-phase reaction in the presence of a radical initiator or a gas-phase reaction at a cleavage temperature of the molecule of chlorine or higher.

12. The method for producing the polycrystalline silicon according to claim 1, wherein a reaction temperature in the hydrogenation step is approximately 600 to 1,200° C.

13. The method for producing the polycrystalline silicon according to claim 1, wherein a reaction temperature in the hydrogenation step is approximately 400 to 600° C., and the hydrogenation reaction is carried out in the presence of silicon.

14. The method for producing the polycrystalline silicon according to claim 13, wherein hydrochloric acid (HCl) is supplied to the hydrogenation step at the same time.

15. The method for producing polycrystalline silicon according to claim 1, wherein the chlorination step (B) includes reacting pentachlorodisilane with chlorine to form silicon tetrachloride and hydrogen chloride.

16. The method for producing polycrystalline according to claim 1, wherein the chlorination step (B) is carried out without a catalyst.

17. A method for producing polycrystalline silicon comprising:
(A) a CVD step of making trichlorosilane (TCS) react with hydrogen to make polycrystalline silicon deposit on a base material;
(B) a chlorination step of making a by-product mixture which is produced in the CVD step and contains poly-silane represented by a chemical formula $H_{2(n+1)-m}Cl_m Si_n$ (wherein n is an integer of 2 to 4 and m is an integer of 0 to 2(n+1)) to react with chlorine and forming tetrachlorosilane (STC) distillate;
(C) a hydrogenation step of making tetrachlorosilane (STC) distillate formed in the chlorination step react with hydrogen into the trichlorosilane (TCS); and
(D) a separation step of separating the hyper-chlorinated methyl chlorosilane from the tetrachlorosilane (STC) distillate with residual carbon from the reactor or present in the silicon.

18. A method for producing polycrystalline silicon comprising:
(A) a CVD step of making trichlorosilane (TCS) react with hydrogen to make polycrystalline silicon deposit on a base material;
(B) a chlorination step of making a by-product mixture which is produced in the CVD step and contains poly-silane represented by a chemical formula $H_{2(n+1)-m}Cl_m Si_n$ (wherein n is an integer of 2 to 4 and m is an integer of 0 to 2(n+1)) to react with chlorine and forming tetrachlorosilane (STC) distillate;
(C) a hydrogenation step of making tetrachlorosilane (STC) distillate formed in the chlorination step react with hydrogen into the trichlorosilane (TCS); and
(D) a separation step of separating the distillate produced in the hydrogenation step into the distillate containing the methyl chlorosilane (MeCS) from reaction with residual carbon from the reactor or present in the silicon and the distillate containing the hyper-hydrogenated chlorosilane.

19. A method for producing polycrystalline silicon comprising:
(A) a CVD step of making trichlorosilane (TCS) react with hydrogen to make polycrystalline silicon deposit on a base material;
(B) a chlorination step of making a by-product mixture which is produced in the CVD step and contains poly-silane represented by a chemical formula $H_{2(n+1)-m}Cl_m Si_n$ (wherein n is an integer of 2 to 4 and m is an integer of 0 to 2(n+1)) to react with chlorine and forming tetrachlorosilane (STC) distillate; and
(C) a hydrogenation step of making tetrachlorosilane (STC) distillate formed in the chlorination step react with hydrogen into the trichlorosilane (TCS);
wherein a chlorination reaction in the chlorination step is carried out through any of a liquid-phase reaction under irradiation with light, a liquid-phase reaction in the presence of a radical initiator or a gas-phase reaction at a cleavage temperature of the molecule of chlorine or higher.

* * * * *